United States Patent [19]
Elsner et al.

[11] Patent Number: 5,550,387
[45] Date of Patent: *Aug. 27, 1996

[54] SUPERLATTICE QUANTUM WELL MATERIAL

[75] Inventors: Norbert B. Elsner; Saeid Ghamaty, Both of La Jolla, Calif.

[73] Assignee: Hi-Z Corporation, San Diego, Calif.

[*] Notice: The term of this patent shall not extend beyond the expiration date of Pat. No. 5,436,467.

[21] Appl. No.: 297,601

[22] Filed: Aug. 29, 1994

Related U.S. Application Data

[63] Continuation-in-part of Ser. No. 185,562, Jan. 24, 1994, Pat. No. 5,436,467.

[51] Int. Cl.$^6$ ............... H01L 29/06; H01L 29/12; H01L 23/38; F25B 21/02
[52] U.S. Cl. ............... 257/15; 257/18; 257/613; 257/614; 257/616; 257/930; 62/3.2; 136/203
[58] Field of Search ............... 257/15, 18, 613, 257/614, 616, 625, 930; 62/3.2; 136/203

[56] References Cited

U.S. PATENT DOCUMENTS

| | | | |
|---|---|---|---|
| 3,780,425 | 12/1973 | Penn et al. | 257/930 |
| 4,835,059 | 5/1989 | Kodato | 257/930 |
| 4,857,972 | 8/1989 | Jorke et al. | 257/18 |

FOREIGN PATENT DOCUMENTS

| | | | |
|---|---|---|---|
| 2-178958 | 7/1990 | Japan | 257/930 |
| 4-099075 | 3/1992 | Japan | |
| 5-226579 | 9/1993 | Japan | |

OTHER PUBLICATIONS

"The Maximum Possible Conversion Efficiency of Silicon-Germanium", Slack & Hussain, J. Appl. Phys, vol. 70 No. (5) Sep. 91.

"Thermoelectric Figure of Merit of a one-dimensional conductor" Hicks & Dresselhaus, Am. Phy. Soc 1993 vol. 47#24, Jun. 1993.

Solid State Superlattices, Döhler, Scientific Am. Nov. 1993.

*Primary Examiner*—Mahshid Saadat
*Attorney, Agent, or Firm*—John R. Ross

[57] ABSTRACT

A thermoelectric element having a very large number of alternating layers of semiconductor material. The alternating layers all have the same crystalline structure. The inventors have demonstrated that materials produced in accordance with this invention provide figures of merit more than six times that of prior art thermoelectric materials. A preferred embodiment is a superlattice of Si, as a barrier material, and SiGe, as a conducting material, both of which have the same cubic structure. Another preferred embodiment is a superlattice of B—C alloys, the layers of which would be different stoichiometric forms of B—C but in all cases the crystalline structure would be alpha 0. In a preferred embodiment the layers are grown under conditions as to cause them to be strained at their operating temperature range in order to improve the thermoelectric properties.

13 Claims, 2 Drawing Sheets

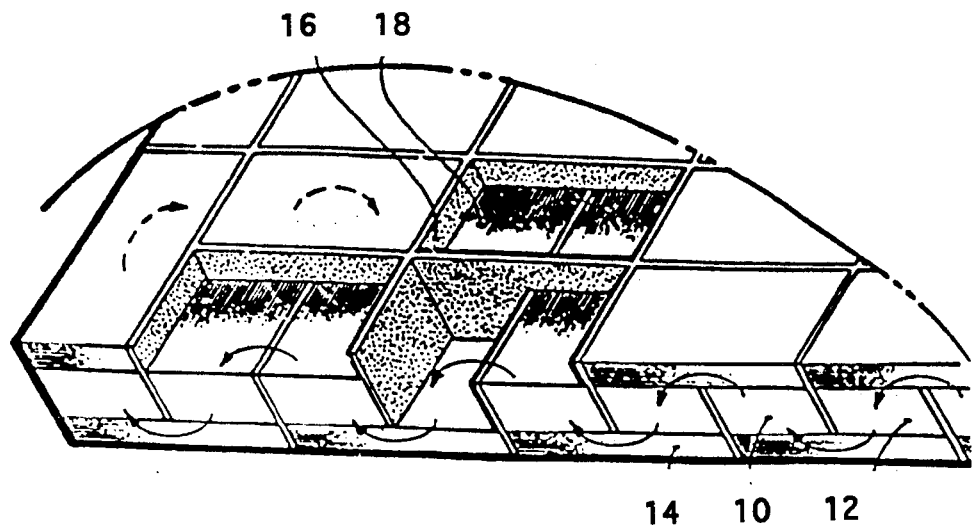
FIG. 3
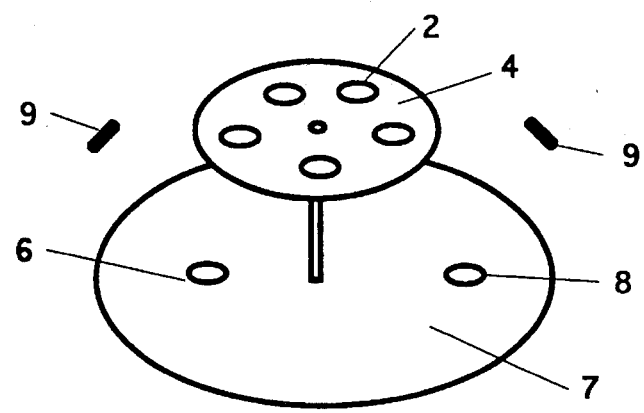
FIG. 1     FIG. 2
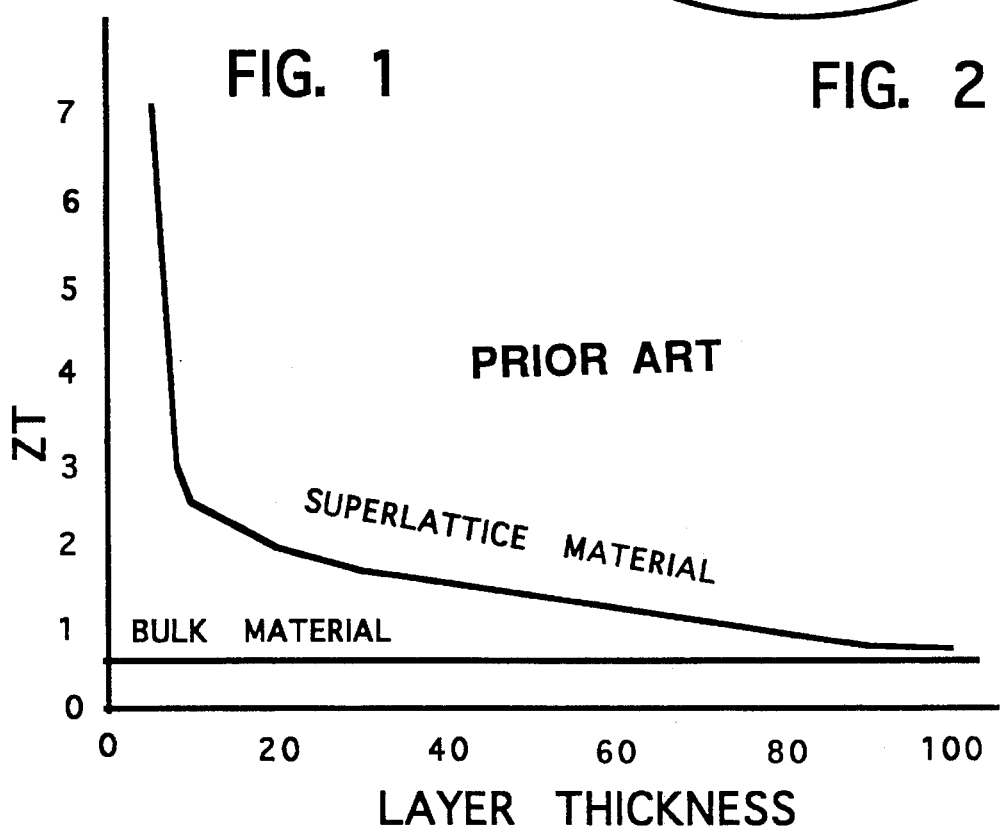

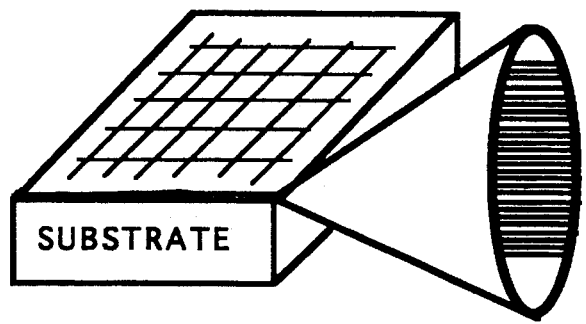
FIG. 4
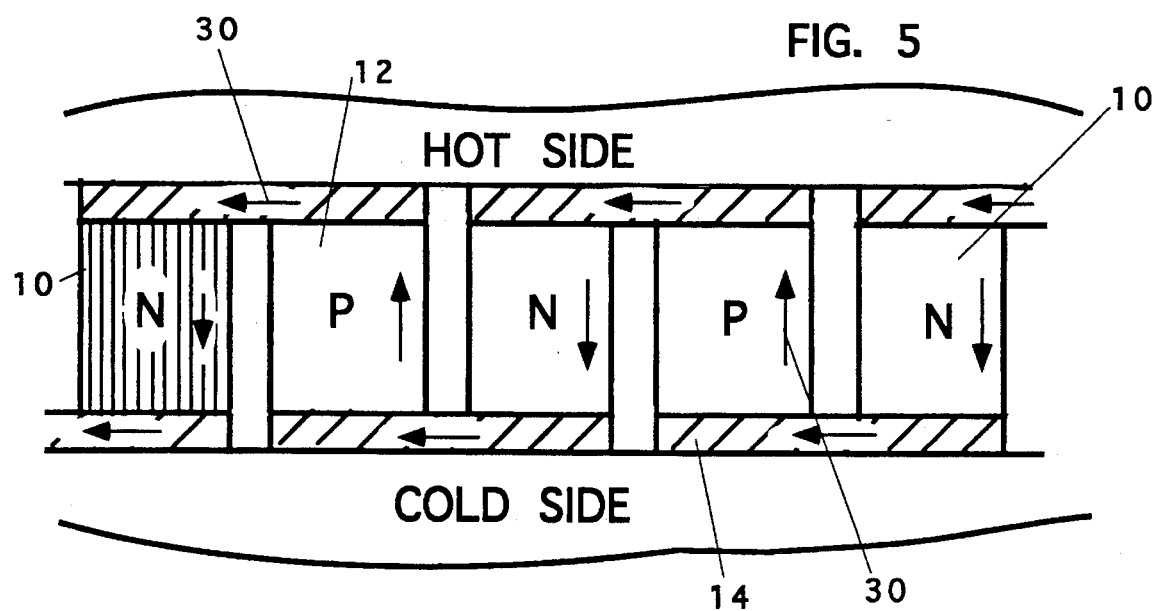

SUPERLATTICE QUANTUM WELL MATERIAL

This application is a continuation-in-part of Ser. No. 08/185,562 filed Jan. 24, 1994, now U.S. Pat. No. 5,436,467.

This invention relates to thermoelectric devices and in particular to materials for such devices.

BACKGROUND OF THE INVENTION

Thermoelectric devices for cooling and heating and the generation of electricity have been known for many years; however, their use has not been cost competitive except for limited applications because of the lack of thermoelectric materials having the needed thermoelectric properties.

A good thermoelectric material is measured by its "figure of merit" or Z, defined as $$Z=S^2/\rho K$$

where S is the Seebeck coefficient, $\rho$ is the electrical resistivity, and K is the thermal conductivity. The Seebeck coefficient is further defined as the ratio of the open-circuit voltage to the temperature difference between the hot and cold junctions of a circuit exhibiting the Seebeck effect, or $$S=V/(T_h-T_c).$$

Therefore, in searching for a good thermoelectric material, we look for materials with large values of S, and low values of $\rho$ and K.

Thermoelectric materials currently in use today include the materials listed below with their figures of merit shown:

| Thermoelectric Material | Peak Zeta, Z (at temperature shown) | ZT |
|---|---|---|
| Lead telluride | $0.9 \times 10^{-3}/°K.$ at 500° K. | 0.9 |
| Bismuth telluride | $3.2 \times 10^{-3}/°K.$ at 300° K. | 1.0 |
| Silicon germanium | $0.8 \times 10^{-3}/°K.$ at 1100° K. | 0.9 |

Workers in the thermoelectric field have been attempting to improve the figure of merit for the past 20–30 years with not much success. Most of the effort has been directed to reducing the lattice thermal conductivity (K) without adversely affecting the electrical conductivity.

Experiments with superlattice quantum well materials have been underway for several years. These materials were discussed in an paper by Gottfried H. Dohler which was published in the November 1983 issue of Scientific American. This article presents an excellent discussion of the theory of enhanced electric conduction in superlattices. These superlattices contain alternating conducting and barrier layers. These superlattice quantum well materials are crystals grown by depositing semiconductors in layers whose thicknesses is in the range of a few to up to about 100 angstroms. Thus, the layers can be as thin as only a few atoms thick. There has been speculation that these materials might be useful as thermoelectric materials. (See articles by Hicks, et al and Harman published in the Proceedings of 1992 1st National Thermoelectric Cooler Conference Center for Night Vision & Electro Optics, U.S. Army, Fort Belvoir, Va. FIG. 1 has been extracted from the Hicks paper and is included herein as prior art. It projects theoretically very high ZT values as the layers are made progressively thinner.) The idea being that these materials might provide very great increases in electric conductivity without adversely affecting the Seebeck coefficient or the thermal conductivity. Harmon of Lincoln Labs, operated by MIT has claimed that he is close to producing a superlattice of layers of (Bi,Sb) and Pb(Te,Se), but to the best of Applicants' knowledge, he has not been successful in producing quantum wells. He claims that his preliminary measurements suggests ZTs of 3 to 4 are possibly feasible. Most of the thermoelectric efforts to date with superlattices have involved alloys such as BeTe which are known to be good thermoelectric materials for cooling, many of which are difficult to manufacture as superlattices because the stoichiometry of the alloys have to be very carefully controlled which is very difficult in vapor deposition techniques. Bulk SiGe is not a good thermoelectric material at low temperatures. Superlattices tend to diffuse at high temperatures and lose their superlattice qualities.

Researchers investigating opto-electronic properties of multilayer quantum well structures have considered the effects of strain in the layers. These researchers (e.g., Abstrater, et al., Phy. Lett. S4, 2441 (1985)) report increased electron mobility due to the strain effect.

What is needed are thermoelectric materials with improved ZT values which permit a simplified manufacturing process.

SUMMARY OF THE INVENTION

The present invention provides thermoelectric elements having a very large number of alternating layers of semiconductor material, the alternating layers all having the same crystalline structure. This makes the vapor deposition process easy because the exact ratio of the materials in the layers is not critical. The inventors have demonstrated that materials produced in accordance with this invention provide figures of merit more than six times that of prior art thermoelectric materials. A preferred embodiment is a superlattice of Si, as a barrier material, and SiGe, as a conducting material, both of which have the same cubic structure. Another preferred embodiment is a superlattice of B—C alloys, the layers of which would be different stoichiometric forms of B—C but in all cases the crystalline structure would be alpha rhombohedral. In a preferred embodiment the layers are grown under conditions as to cause them to be strained at their operating temperature range in order to improve the thermoelectric properties.

BRIEF DESCRIPTION OF THE DRAWINGS

FIG. 1 is a graph showing the theoretical thermoelectric properties of superlattice materials.

FIG. 2 is simple drawing showing an apparatus for making superlattice materials.

FIG. 3 shows a thermoelectric eggcrate arrangement.

FIG. 4 shows how the thermoelectric elements are cut from the substrate on which grown.

FIG. 5 shows a portion of a thermoelectric device to show current flow through the elements.

DETAILED DESCRIPTION OF PREFERRED EMBODIMENTS

The present inventors have demonstrated a revolutionary thermoelectric material, with ZT values in excess of 6. This material is comprised of very thin layers of silicon and a solid solution of silicon and germanium. These very thin layers may be forming quantum wells which are know to greatly increase electron mobility which in turn increase electrical conductivity. The principal advantage of the inventors' material over many others that have been suggested is that Si and Ge both have the same crystalline structure so that when the layers Si and SiGe (solid solution) are grown the atoms fit together to form the well ordered lattices.

Making the n-Type Superlattice $Si_{.8}Ge_{.2}/Si$ layers were grown on (100) Si substrates by codeposition from two electron beam evaporation sources in a molecular beam epitaxy. The fluxes from the Si and Ge electron beam sources were separated, sensed and controlled to yield a total deposition rate of 5 A/sec. Prior to deposition, substrates were chemically cleaned, then argon sputtered in situ and annealed at 800°–850° C. Above 500° C., annealing and growth temperatures were measured directly by infrared pyrometry. Then the layers could be alternatively deposited on top of each other to make $Si_{.8}Ge_{.2}/Si$ superlattices with each layer being about 50 A thick.

The actual deposition configuration is illustrated schematically in FIG. 1. Five substrates 2 are mounted on the bottom of platen 4 which rotates at a rate of 1 revolution per second. The platen is 50 cm in diameter and the substrate wafers are each 125 mm in diameter. Two deposition sources 6 and 8 are mounted on a source flange 7 such that their deposition charges are about 20 cm from the axis 5. Deposition source 6 is pure silicon and deposition source 8 is germanium doped to $\sim 10^{16}$ carriers per cc. The rotating platen is positioned 23 cm above the sources. An Airco Temescal electron beam is used for evaporation. We use one 150 cc source of pure silicon and a 40 cc source of germanium. We alternate the beams so layers of silicon only and silicon and germanium are deposited. Dopants may be mixed with the germanium.

The apparatus is computer controlled to evaporate the sources alternatively at intervals appropriate to achieve the desired thicknesses while the platen rotates above. Layer thicknesses are monitored by two electroluminescent deposition meters 9 at the side of platen 4. Layers will continue to build on the substrates until we have a wafer with about 250,000 layers and a thickness of about 0.254 cm. which is the thickness needed for a preferred thermoelectric device. The wafer is then diced into chips as indicated in FIG. 2.

Making the p-Type Superlattice

We make the p-type material exactly as discussed above except we use a p-type dopants for the SiGe layers. These layers are boron doped for p-type material and antimony doped for n-type material.

Other Techniques for Making n-Type and p-Type Material

Molecular beam epitaxy equipment for making the n-type and p-type layered material is commercially available from several suppliers such as Instruments SA Inc., Riber Div. with offices in Edison, N.J. The material can also be prepared using sputtering techniques. Sputtering equipment adequate for making these materials is also commercial available from suppliers such as Kurt J. Lesker Co. with offices in Clairton, Pa.

Sputtering is done in a manner similar to the techniques used for the fabrication of X-ray optics. Vacuum is established and maintained by a two-stage mechanical roughing pump and a high-capacity cryogenic pump. The system usually achieves base pressures of approximately $10^{-9}$ torr after bake-out and before sputtering. Substrates are mounted on a rotating carousel driven by a precision stepper motor.

Substrates can be heated or cooled by the carousel during sputtering. Heating of the substrate during deposition and subsequent annealing is used as a means of controlling the structure and orientation of individual crystalline layers, as well as means of reducing the number of defects in the films. (We can also control the temperature in order to enhance strain within the layers as a function of temperature as discussed later.) One of the essential conditions for epitaxial film growth is a high mobility of condensed atoms and molecules on the surface of the substrate. Two 1 kW magnetrons, each having a 2–5-inch diameter target and a 1 kW power supply, are used to deposit films. The sputter sources are operated at an argon pressure between 0.001 and 0.1 torr. Argon is admitted to the system by a precision flow controller. All functions of the system, including movement of the carousel, rates of heating and cooling, magnetron power, and argon pressure, are computer controlled.

Making the Thermoelectric Element

The p-type and the n-type chips are formed into an egg crate configuration in a manner standard in the industry. Metal contacts are applied then all n and p legs are electrically shorted. The n and p couples are electrically isolated by lapping the surface until the insulating egg crate is visible and a series circuit of n and p elements is produced. In FIG. 3 elements shown are n-type thermoelectric elements 10, p-type thermoelectric elements 12, aluminum electrical connectors 14, eggcrate electrical barrier 16 and molybdenum diffusion barrier 18. FIG. 4 shows how the chips are cut from the silicon substrate. FIG. 5 is another view showing how the n elements 10 and p elements 12 are connected to produce electric power from hot and cold sources. Arrows 30 show current flow. Insulators are shown as 22 and electrical conductors are shown as 14.

Test Results

Materials produced in accordance with the teachings of this invention have been tested by the inventors. The tested thermoelectric properties of both n-type and p-type samples of $Si_{.8}Ge_{.2}/Si$ are compared in Table I with the properties of bulk material with the same ratios of Si and Ge:

TABLE I

| Sample $Si_{.8}Ge_{.2}/Si$ | Electrical Resistivity $\rho$ (m$\Omega$-cm) | Seebeck Coef. $\alpha$ ($\mu$V/oC) | Carrier Conc. n (1/cm) | Power Factor $\alpha 2/\rho$ ((/1000) | Figure of Merit Z (1/K) | Z(Abs Temp) (T = 300° K.) ZT |
|---|---|---|---|---|---|---|
| Sample 1 N | 0.52 | −260 | $10^{16}$ | 120 | $1.6 \times 10^{-3}$ | 0.5 |
| Sample 2 N | 4 | −1250 | $10^{19}$ | 391 | $5.1 \times 10^{-3}$ | 1.5 |
| Sample 3 P | 1.44 | +850 | $10^{15}$ | 293 | $3.8 \times 10^{-3}$ | 1.2 |

TABLE I-continued

| Sample $Si_8Ge_2/Si$ | Electrical Resistivity ρ (mΩ-cm) | Seebeck Coef. α (μV/oC) | Carrier Conc. n (1/cm) | Power Factor α2/ρ ((/1000)) | Figure of Merit Z (1/K) | Z(Abs Temp) (T = 300° K.) ZT |
|---|---|---|---|---|---|---|
| Sample 4 P | 1.94 | +850 | $10^{19}$ | 218 | $2.9 \times 10^{-3}$ | 0.9 |
| Sample 5 P | 1.74 | +850 | $10^{20}$ | 243 | $3.2 \times 10^{-3}$ | 1.0 |
| Sample 6 P | 1.4 | +850 | $5 \times 10^{20}$ | 302 | $4.0 \times 10^{-3}$ | 1.2 |
| Bulk $Si_8Ge_{.2}$ P | 1 | +130 | $10^{20}$ | 17 | $.3 \times 10^{-3}$ | 0.1 |
| Bulk $Si_8Ge_{.2}$ N | 2 | −200 | $10^{20}$ | 20 | $.33 \times 10^{-3}$ | 0.1 |

The data reported in Table 1 was obtained with thin samples of about 10 alternating layers deposited on a silicon substrate. All measured values were corrected for the effect of the silicon substrate for a total thickness of about 1,000 A. These Z values in the range of $1.6 \times 10^{-3}$/K to $5.1 \times 10^{-3}$/K are amazingly high, approximately an order of magnitude higher than Si.8 Ge.2. These results are also amazing in view of a prediction in 1991 that the maximum possible Z for SiGe was about $1.7 \times 10^{-3}$ for p-type elements and about $1.9 \times 10^{-3}$/K for n-type elements. (See Slack and Hussain, "The maximum possible conversion efficiency of silicon-germanium thermoelectric generators", J. Appl. Phys. 70 (5), 1 Sep. 1991.)

Strain Effect

Applicant's have concluded that strain in the layers can have a very beneficial effect on the thermoelectric properties of the multi-layer elements. In-plane stresses cause tensile strains in the Si layers and compressive strains in the SiGe layers, with opposite strains in the direction normal to the layer plane. The strain induce splittings and shifts of the conduction-band minima. This helps assure that the conduction band of the wider-gap material, Si, is lower in energy than that of the conduction band material, SiGe. The net effect is that the electron mobility in the multi-layer element is enhanced. These types of strain would have a temperature dependency of $T^3$. Because of the positive contribution of strain to electron mobility, we prefer to tailor our fabrication process to assure that at the planned operating temperature of the elements the layers are under strain as indicated above. One method of assuring that this is the case is to fabricate the multi-layer elements at a temperature at least 200 C. above the planned operating temperature. Other methods for creating this strain will be apparent to persons skilled at molecular beam epitaxy and sputtering techniques.

Similar High Temperature Lattices

The Si/SiGe superlattice is not stable at very high temperatures for very long periods (i.e., above about 500° C.); therefore, there is a need for a similar superlattice which can be operated at these high temperatures. Boron and Boron-Carbon alloys are also expected to perform as excellent p-type thin-layer (possibly quantum well) materials. The same alpha rhombohedral crystal structure exists over a wide range of composition from $B_4C$ to $B_{11}C$. As the B content is increased in going from $B_4C$ to $B_{11}C$ the B atoms substitute for C atoms. As a result of this progressive change in composition without a change in structure it should be possible to grow epitaxial layers of various B—C compositions on one another. From data generated on bulk B—C alloys one should be able to fabricate a device by using compositions close to $B_{11}C$ as the insulating layer and compositions close to $B_4C$ as the more conducting layer.

Also pure alpha boron which is rhombohedral could be used as the insulating layer. The B—C alloys are of further interest because these alloys exhibit extremely low diffusion rates at temperatures at which they would be used as thermoelectric materials. For example, the B—C alloys of interest melt at temperatures in excess of 2400° C. yet they will only be operated up to about 1100° C. By using materials such as B—C alloys the thin layers will remain intact at elevated temperatures and not be subject to degradation by adjacent layers diffusing together with time. This annihilation of the two adjacent layers via diffusion is of serious concern with the lower melting alloys such as Si/SiGe, PbTe based alloys, and $(Bi,Sb)_2(Se,Te)_3$ based alloys and limits their usefulness in high temperature applications.

While the above description contains many specificities, the reader should not construe these as limitations on the scope of the invention, but merely as exemplifications of preferred embodiments thereof. For example, the SiGe ratio could be any composition between about 5 percent Ge to about 95 percent Ge; however, the preferred composition is between about 10 percent Ge and about 40 percent Ge. Those skilled in the art will envision many other possible variations are within its scope. Persons skilled in the thermoelectric art are aware of many different dopants other than the ones discussed above which would produce similar effects. Examples of n-type dopants include phosphorus and arsenic. Examples of p-type dopants in addition to boron are aluminum and antimony. Persons skilled in the art will recognize that is is possible to produce quantum layers having the same crystalline structures from materials having different crystal structures. For example, epitaxial layers of GeTe and PbTe could be fabricated even though PbTe and GeTe differ slightly in crystalline structure. Accordingly the reader is requested to determine the scope of the invention by the appended claims and their legal equivalents, and not by the examples which have been given.

We claim:

1. A thermoelectric element for use in a thermoelectric device comprised of:

a plurality of alternating layers of at least two different semiconducting materials, the first of said two materials, defining a barrier material and the second of said two materials defining a conducting material, said alternating materials defining band gaps, said barrier material and said conducting material being strained having the same crystalline structure, said barrier material having a band gap higher than the band gap of said conducting material, said conducting material being doped to create conducting properties, said layer arrangement of said at least two different materials creating a superlattice and quantum wells within said layers of said conducting material.

2. A thermoelectric element as in claim 1 wherein said crystal structure is cubic.

3. A thermoelectric element as in claim 2 wherein said barrier material is silicon and said conducting material is silicon germanium.

4. A thermoelectric element as in claim 3 wherein the concentration of germanium in said conducting material is between 10 percent and 40 percent.

5. A thermoelectric element as in claim 4 wherein said conducting material is doped with a dopant.

6. A thermoelectric element as in claim 5 wherein said dopant is an n-type dopant.

7. A thermoelectric element as in claim 5 wherein said dopant is a p-type dopant.

8. A thermoelectric element as in claim 1 wherein said plurality of alternating layers is at least 100 layers with each of said 100 layers being less than 100 Å thick.

9. A thermoelectric element as in claim 1 wherein said crystal structure is alpha rhombohedral.

10. A thermoelectric element as in claim 4 wherein at least one of said two different materials is an alloy of boron and carbon.

11. A thermoelectric element as in claim 4 wherein at least two of said at least two different materials are both alloys of boron and carbon.

12. A thermoelectric element as in claim 1 wherein said barrier material is strained in tension and said conduction material is strained in compression.

13. A thermoelectric element as in claim 1 wherein said element defines an operating temperature range and is fabricated at a temperature higher than said operating temperature range so as to cause said barrier material and said conduction material to be strained.

* * * * *